(12) United States Patent
Loy et al.

(10) Patent No.: US 12,101,944 B2
(45) Date of Patent: Sep. 24, 2024

(54) SEMICONDUCTOR MEMORY DEVICES

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 678 days.

(21) Appl. No.: 17/172,085

(22) Filed: Feb. 10, 2021

(65) Prior Publication Data
US 2022/0254833 A1  Aug. 11, 2022

(51) Int. Cl.
| | | |
|---|---|---|
| *H01L 45/00* | (2006.01) | |
| *H10B 63/00* | (2023.01) | |
| *H10N 70/00* | (2023.01) | |
| *H10N 70/20* | (2023.01) | |

(52) U.S. Cl.
CPC .......... *H10B 63/82* (2023.02); *H10N 70/021* (2023.02); *H10N 70/24* (2023.02); *H10N 70/823* (2023.02); *H10N 70/841* (2023.02); *H10N 70/8833* (2023.02)

(58) Field of Classification Search
CPC ........................... H10N 70/823; H10N 70/011
See application file for complete search history.

(56) References Cited

U.S. PATENT DOCUMENTS

| | | | |
|---|---|---|---|
| 8,941,110 B2 * | 1/2015 | Joshi | H10N 70/20 257/209 |
| 9,431,604 B2 | 8/2016 | Liao et al. | |
| 11,217,747 B2 * | 1/2022 | Loy | H10N 70/021 |
| 2009/0278109 A1 | 11/2009 | Phatak | |
| 2021/0273160 A1 | 9/2021 | Loy et al. | |
| 2022/0209109 A1 * | 6/2022 | Loy | H10N 70/021 |

OTHER PUBLICATIONS

Chuang et al., Effects of Electric Fields on the Switching Properties Improvements of RRAM Device With a Field-Enhanced Elevated-Film-Stack Structure, IEEE Journal of the Electron Devices Society, May 2018, IEEE.

* cited by examiner

*Primary Examiner* — Mark V Prenty
(74) *Attorney, Agent, or Firm* — David Cain

(57) ABSTRACT

The embodiments herein relate to semiconductor memory devices and methods of forming the same. A semiconductor memory device is provided. The semiconductor memory device includes a memory cell having a first electrode, a second electrode, a switching layer, and a via structure. The second electrode is adjacent to a side of the first electrode and the switching layer overlays uppermost surfaces of the first and second electrodes. The via structure is over the uppermost surface of the second electrode.

19 Claims, 8 Drawing Sheets

SEMICONDUCTOR MEMORY DEVICES

TECHNICAL FIELD

The present disclosure relates generally to semiconductor devices, and more particularly to semiconductor memory devices and methods of forming the same.

BACKGROUND

Semiconductor memory devices can be generally split into volatile memory devices and non-volatile memory (NVM) devices. Resistive random-access memory (RRAM) device is a type of non-volatile memory (NVM) devices for use in advanced computing systems, such as for processing-in-memory (PIM) applications and machine learning (ML) applications using binary neural network (BNN)-based techniques. RRAM devices are suitable for such applications as they can provide high-density architecture with high parallel programming speed and low power consumption.

A typical RRAM device uses a switching layer interposed between two electrodes. The switching layer is normally insulating. However, upon application of a sufficiently large potential difference between the electrodes, conductive filaments may be formed within the switching layer, making the switching layer conductive. However, the conductive filaments are often formed at random across many locations within the switching layer, thereby subjecting the RRAM device to undesirable device-to-device variability and cycle-to-cycle variability.

Therefore, it is desirable to provide semiconductor memory devices having improved device performance and methods of forming the same to overcome, or at least ameliorate, the disadvantages described above.

SUMMARY

To achieve the foregoing and other aspects of the present disclosure, semiconductor memory devices and methods of forming the same are presented.

According to an aspect of the present disclosure, a memory device is provided. The memory device includes a memory cell having a first electrode, a second electrode, a switching layer, and a via structure. The second electrode is adjacent to a side of the first electrode and the switching layer overlays uppermost surfaces of the first and second electrodes. The via structure is over the uppermost surface of the second electrode.

According to another aspect of the present disclosure, a semiconductor memory device is provided. The semiconductor memory device includes a first electrode, a second electrode, a third electrode, a first insulating element, a second insulating element, and a switching layer. The second and third electrodes are adjacent to and at laterally opposite sides of the first electrode. The first insulating element is between the first and second electrodes and the second insulating element is between the first and third electrodes. The switching layer is overlying uppermost surfaces of the first electrode, the second electrode, the third electrode, the first insulating element, and the second insulating element.

According to yet another aspect of the present disclosure, a method of forming a semiconductor memory device is provided. The method includes forming a first electrode and a second electrode adjacent to the first electrode. An insulating element is formed between the first and second electrodes. A switching layer is formed overlying uppermost surfaces of the first and second electrodes. The switching layer, the first electrode, and the second electrode form a memory cell of the memory device.

BRIEF DESCRIPTION OF THE DRAWINGS

The embodiments of the present disclosure will be better understood from a reading of the following detailed description, taken in conjunction with the accompanying drawings.

Figure 1:
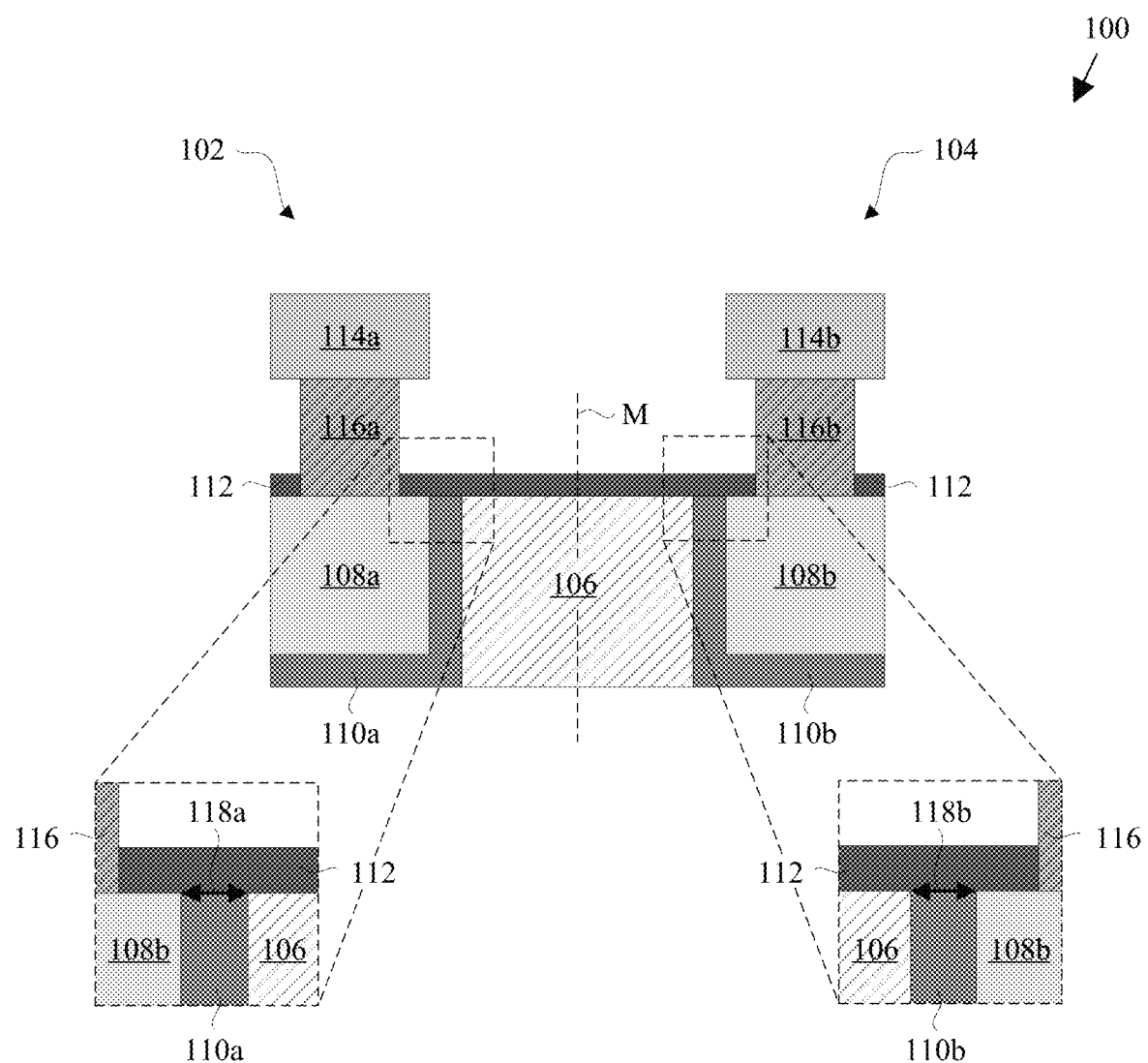
FIG. 1 is a cross-sectional view of a semiconductor memory device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates generally to semiconductor devices, and more particularly to semiconductor memory devices having improved device performances and methods of forming the same.

A resistive random-access memory (RRAM) cell generally includes a pair of electrodes and a switching layer interposed between the pair of electrodes. The switching layer of the RRAM cell is normally insulative.

The RRAM cell operates by switching between states based on the resistance of the switching layer. For example, upon application of a sufficiently large potential difference between the pair of electrodes, a dielectric breakdown event may occur and the switching layer becomes conductive with the formation of one or more conductive filaments within the switching layer. The switching layer may revert to the insulative state by applying a sufficiently small potential difference between the pair of electrodes to break the one or more conductive filaments.

When the switching layer is insulative, the switching layer has a relatively high resistance and the RRAM cell may be referred to as being in a high-resistance state (HRS). When the switching layer is conductive, the switching layer has a relatively low resistance and the RRAM cell may be referred to as being in a low-resistance state (LRS). To program the RRAM cell, the RRAM cell is switched from the HRS to the LRS. To erase the RRAM cell, the RRAM cell is switched from the LRS to the HRS.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1 is a cross-sectional view of a memory device 100, according to an embodiment of the disclosure. The memory device 100 may be arranged in a memory cell region of a semiconductor device and the memory device 100 may be part of a plurality of memory devices arranged in an array configuration of rows and columns in the memory cell region. Only one memory device is illustrated for clarity purposes.

The memory device 100 may include a plurality of memory cells, including a first memory cell 102 and a second memory cell 104. Each memory cell 102, 104 may be a one-bit memory cell. Accordingly, the memory device 100 may be a two-bit memory device. The memory device 100 may be arranged over a base insulating layer (not shown), where the base insulating layer may be an interlayer dielectric layer (ILD). In an embodiment of the disclosure, the memory device 100 is a RRAM device.

As illustrated in FIG. 1, the memory device 100 may include a first electrode 106. The first electrode 106 may be a common electrode shared between the first and second memory cells 102, 104. The first electrode 106 may be referred to as an inert electrode. In an embodiment of the disclosure, the first electrode 106 may include an inert conductive material, such as but not limited to, ruthenium, platinum, titanium nitride, tantalum nitride, combinations thereof, or other inert conductive materials known to those skilled in the art. In another embodiment of the disclosure, the first electrode 106 may have a thickness in a range of about 5 to about 10 nm.

Each memory cell 102, 104 may further include a second electrode 108a, 108b, respectively, and an insulating element 110a, 110b, respectively. The second electrodes 108a, 108b may be referred to as active electrodes. The insulating elements 110a, 110b may be referred to as hard mask elements.

Referring to the first memory cell 102, the second electrode 108a may be arranged adjacent to a first side surface of the first electrode 106. In an embodiment of the disclosure, the second electrode 108a may have an upper surface substantially coplanar with an upper surface of the first electrode 106. In another embodiment of the disclosure, the second electrode 108a may include a conductive material such as, but not limited to, tantalum, hafnium, titanium, copper, silver, cobalt, tungsten, combinations thereof, or other conductive materials known to those skilled in the art. In yet another embodiment of the disclosure, the second electrode 108 may have a thickness in a range of about 5 to about 30 nm.

The insulating element 110a of the first memory cell 102 may be arranged between the first and second electrodes 106, 108a. The insulating element 110a may be directly contacting the first side surface of the first electrode 106 and a first side surface of the second electrode 108a. The insulating element 110a may have an uppermost surface substantially coplanar with the upper surfaces of the first and second electrodes 106, 108a. In an embodiment of the disclosure, the insulating element 110 may further underlie the second electrode 108a and acquire an "L-shaped" profile. The insulating element 110a may have a substantially coplanar side surface with a second side surface of the second electrode 108a; the second side surface of the second electrode 108a being laterally opposite the first side surface. In another embodiment of the disclosure, the insulating element 110a may include an electrically insulative material such as, but not limited to, various metal nitrides, for example, silicon nitride or other electrically insulative materials known to those skilled in the art. In yet another embodiment of the disclosure, the insulating element 110a may have a thickness at most of about 10 nm.

The second memory cell 104 of the memory device 100 may be a mirror-image of the first memory cell 102; the second memory cell 104 having mirror symmetry about an axis M through the center of the first electrode 106. Similar to the first memory cell 102, the second memory cell 104 may include a second electrode 108b and an insulating element 110b.

The memory device 100 may yet further include a switching layer 112. The switching layer 112 may overlay and directly contact the upper surfaces of the first and second electrodes 106, 108a, 108b, and the uppermost surface of the insulating elements 110a, 110b of the first and second memory cells 102, 104. As illustrated in FIG. 1, the switching layer 112 may extend entirely over the upper surface of the first electrode 106. The switching layer 112 may include a dielectric material having a lower dielectric breakdown voltage than that of the electrically insulative material of the insulating elements 110a, 110b. In an embodiment of the disclosure, the switching layer 112 may include various metal oxides, for example, magnesium oxide, tantalum oxide, hafnium oxide, titanium oxide, aluminum oxide, silicon oxide, combinations thereof, or other dielectric materials known to those skilled in the art.

The switching layer 112 may be configured with a thickness such that, upon application of a predetermined potential difference between the first and second electrodes 106, 108a, 108b, the state of the switching layer 112 may be switched between the HRS and the LRS. The voltage required for the operation of the first memory cell 102 may further vary with the technology node and the type of memory cells fabricated. In an embodiment of the disclosure, the switching layer 112 may have a thickness in a range of about 2 to about 10 nm.

Each memory cell 102, 104 may be provided with a line structure 114a, 114b electrically coupled to the second electrodes 108a, 108b, respectively. It will be understood that when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

Each line structure 114a, 114b may serve as a bit line of the first and second memory cells 102, 104, respectively. In an embodiment of the disclosure, an electrically conductive via structures 116a, 116b may be arranged between the line structures 114a, 114b and the second electrodes 108a, 108b. The line structures 114a, 114b may be electrically coupled to the second electrodes 108a, 108b through the via structures 116a, 116b, respectively. The via structures 116a, 116b may extend through the switching layer 112 to be electrically coupled to the second electrodes 108a, 108b. The line structures 114a, 114b and the via structures 116a, 116b may include an electrically conductive material such as, but not limited to, aluminum, copper, tungsten, alloys thereof, combinations thereof, or other electrically conductive materials known to those skilled in the art.

As mentioned above, the memory device 100 may be a two-bit memory device. The first bit of the memory device 100 may correspond to a state of the first memory cell 102 and the second bit of the memory device 100 may correspond to a state of the second memory cell 104. To program the first memory cell 102, a sufficiently large potential difference may be applied between the first and second electrodes 106, 108a of the first memory cell 102 to form one or more conducting filaments 118a between the first and second electrodes 106, 108a. The one or more conducting filaments 118a may be formed laterally between the first and second electrodes 106, 108a. Similarly, to program the second memory cell 104, a sufficiently large potential difference may be applied between the first and second electrodes 106, 108b of the second memory cell 104 to form one or more conducting filaments 118b between the first and second electrodes 106, 108b. The one or more conducting filaments 118b may be formed laterally between the first and second electrodes 106, 108b.

As electric fields generated at corner regions of conductive structures are relatively stronger than that of non-corner regions, these relatively higher electric fields may readily facilitate a pathway for the formation of one or more conducting filaments within the first and second memory cells 102, 104. Furthermore, due to the switching layer 112 having a lower dielectric breakdown voltage than that of the insulating elements 110a, 110b, it may be expected that the one or more conducting filaments 118a, 118b may be formed between the upper corners of the first and second electrodes 106, 108a of the first memory cell 102 and the upper corners of the first and second electrodes 106, 108b of the second memory cell 104. The one or more conducting filaments 118a may be formed laterally between upper corners of the first and second electrodes 106, 108a of the first memory cell 102 and laterally between upper corners of the first and second electrodes 106, 108b of the second memory cell 104 when a sufficiently large potential difference is being applied thereto to cause a dielectric breakdown of the switching layer 112.

The formation of the one or more conductive filaments 118a, 118b may be substantially confined at the interface between the switching layer 112 and the insulating element 110a, 110b, respectively. The confinement of the one or more conducting filaments 118a, 118b at the interfaces is advantageous to minimize the variability of locations where the conducting filaments 118a, 118b may be formed. Such filament confinement reduces the stochasticity of the conducting filaments 118a, 118b, which in turn reduces the resistance variability of the switching layer 112. Controlled distribution of the conducting filaments 118 can lead to desirable process stability such as low device-to-device variability and cycle-to-cycle variability.

Note that although not apparent from FIG. 1, one or more conducting filaments 118a, 118b may be formed anywhere along the insulating element 110a, 110b that are between the first and second electrodes 106, 108a, 108b in the respective memory cells.

The first and second memory cells 102, 104 may be read or programmed independently through their respective line structures 114a, 114b, thereby providing a dual bit line read/write scheme for the memory device 100. For a dual bit line read scheme, for example where the first and second memory cells 102, 104 have been programmed, the line structures 114a, 114b of the respective memory cells 102, 104 will read a relatively high current level. In another example, where the first memory cell 102 is the only memory cell being programmed, the line structure 114a of the first memory cell 102 will read a relatively high current level while the line structure 114b of the second memory cell 104 will read a relatively low current level.

To write or program the memory device 100, a sufficiently large potential difference may be applied between the first and second electrodes 106, 108a of the first memory cell 102 and/or the first and second electrodes 106, 108b of the second memory cell 104. For example, the memory device 100 may be in a (11) state when both memory cells 102, 104 have been programmed. In another example, the memory device 100 may be in a (10) state when only the first memory cell 102 has been programmed and the second memory cell 104 is erased. Likewise, the memory device 100 may be in a (01) state when only the second memory cell 104 has been programmed and the first memory cell 102 is erased.

FIGS. 2A to 2D are cross-sectional views that illustrate a method of forming the memory device 100 in FIG. 1, according to an embodiment of the disclosure. Certain structures may be conventionally fabricated, for example, using known processes and techniques, and specifically disclosed processes and methods may be used to achieve individual aspects of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" includes deposition of material or photoresist, patterning, exposure, development, etching, cleaning, and/or removal of the material or photoresist as required in forming a described pattern, structure, or opening. Exemplary examples of techniques for patterning include, but not limited to, wet etch lithographic processes, dry etch lithographic processes, or direct patterning processes. Such techniques may use mask sets and mask layers with dopants having a desired conductivity type.

Figure 2A:
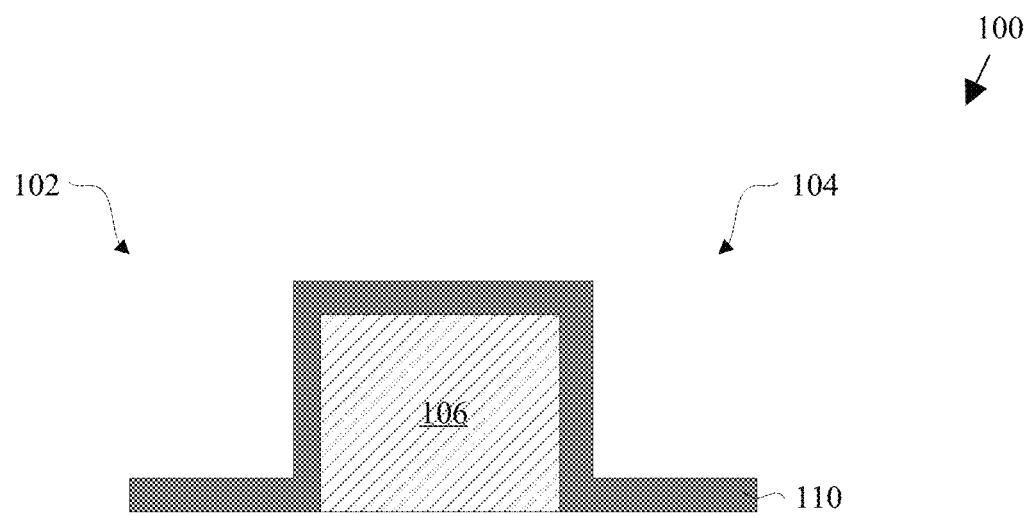
FIGS. 2A to 2D are cross-sectional views that illustrate a method of forming the semiconductor memory device in FIG. 1, according to an embodiment of the disclosure.

FIG. 2A illustrates a first electrode 106 of the memory device 100, according to an embodiment of the disclosure. The memory device 100 may be formed over a base insulating layer (not shown). The memory device 100 may be a two-bit memory device and may include a first region to form a first memory cell 102 and a second region to form a second memory cell 104. The first memory cell 102 and the second memory cell 104 may be formed at laterally opposite sides of the first electrode 106 and may form a bit cell of the memory device 100, respectively.

The first electrode 106 may be formed by depositing a layer of inert conductive material (not shown) over the base insulating layer using a deposition technique and patterning the layer of inert conductive material using a patterning technique. The first electrode 106 may be a common electrode shared between the first and second memory cells 102, 104.

A layer of insulative material 110 may be deposited over the first electrode 106 using a deposition technique. The layer of insulative material 110 may be deposited over the base insulating layer and the first electrode 106. In an embodiment of the disclosure, the layer of insulative material 110 may be deposited using a conformal deposition process; for example, a conformal CVD process or an ALD process.

Figure 2B:
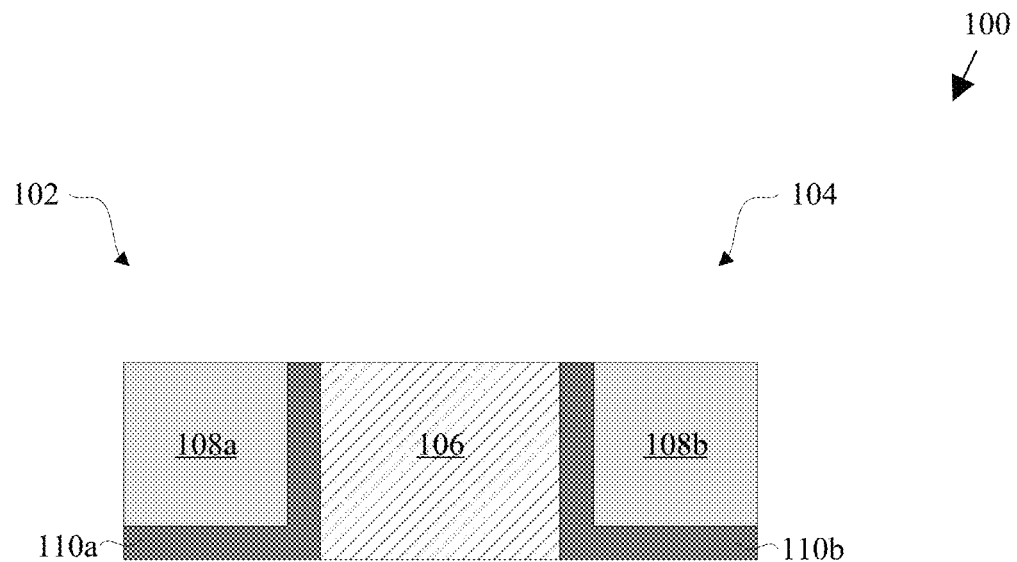

FIG. 2B illustrates the memory device 100 after forming a second electrode 108a, 108b and an insulating element 110a, 110b for each memory cell 102, 104, respectively, according to an embodiment of the disclosure. A conductive material may be deposited over the layer of insulative material 110 using a deposition technique. A planarization technique, such as a chemical-mechanical planarization (CMP) process, may be performed to remove portions of the conductive material and the insulative material 110 to form the second electrodes 108a, 108b and the insulating elements 110a, 110b of the first and second memory cells 102, 104, respectively.

An upper surface of the first electrode 106 may be exposed after the planarization technique. The planarization technique advantageously forms a substantially planar topography over the memory device 100, i.e., upper surfaces of the first and second electrodes 106, 108a, 108b and an uppermost surface of the insulating elements 110a, 110b may be substantially coplanar.

Although not shown in FIG. 2B, a patterning technique may be performed to define and electrically isolate a plurality of memory devices, including the memory device 100. The patterning technique may include using a photoresist mask or reticle to form the plurality of memory devices arranged in an array configuration of rows and columns.

Figure 2C:
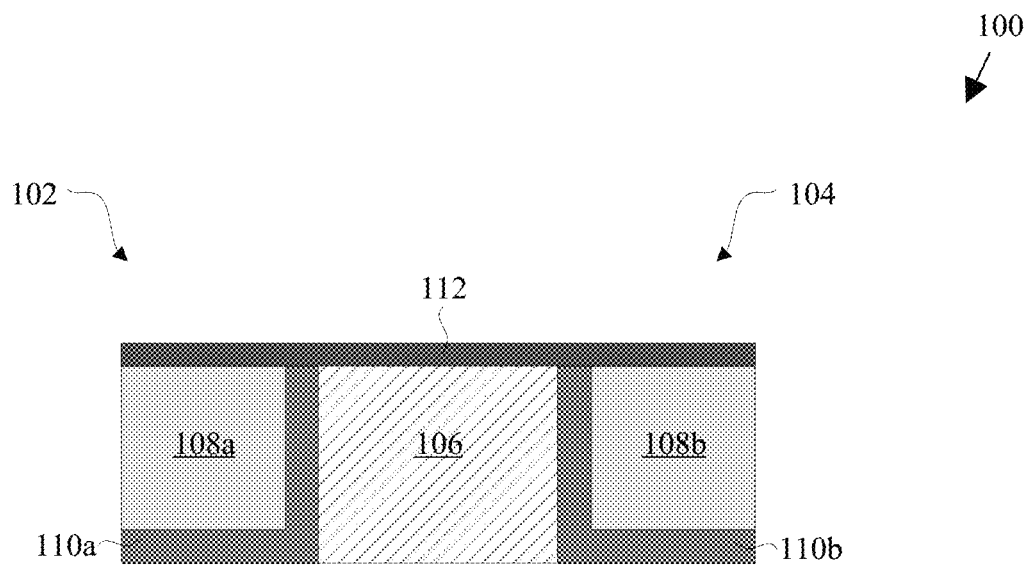

FIG. 2C illustrates the memory device 100 after forming a switching layer 112, according to an embodiment of the disclosure. A layer of dielectric material may be deposited over the memory device 100 using a deposition technique to form the switching layer 112. The switching layer 112 may be expected to acquire a substantially similar planar topography as that formed by the upper surfaces of the first and second electrodes 106, 108a, 108b and the uppermost surface of the insulating elements 110a, 110b. Due to the substantially planar topography, the deposition technique to form the switching layer 112 may be controlled effectively and may not be affected by other process limitations, such as lithography. Hence, a thin switching layer may be formed with a substantially uniform thickness. Substantially thin uniform switching layers may be desired as they provide for stable filament path formation and reduced switching voltages during the operation of the memory devices.

Figure 2D:
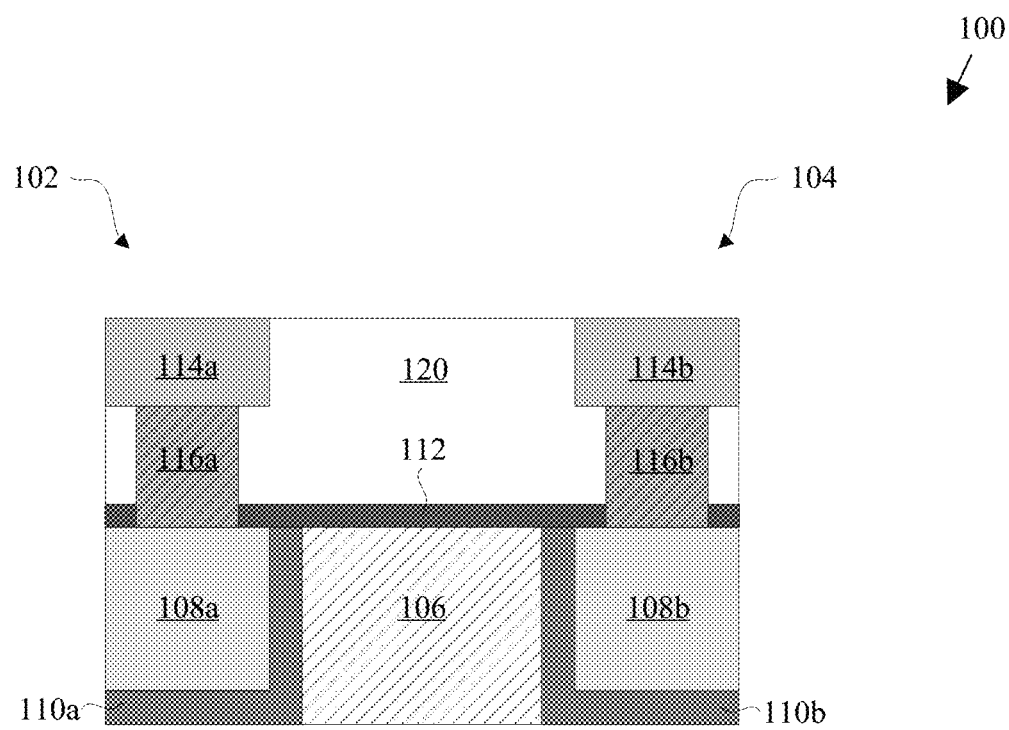

FIG. 2D illustrates the memory device 100 after forming a line structure 114a, 114b and a via structure 116a, 116b for the respective memory cells 102, 104, according to an embodiment of the disclosure. A dielectric layer 120 may be deposited over the switching layer 112 using a deposition technique. The dielectric layer 120 may be referred to as an ILD layer. Openings and/or trenches may be formed in the dielectric layer 120 and an electrically conductive material may be deposited therein to form the line structures 114a, 114b and/or the via structures 116a, 116b. It will be appreciated that the via structures 116a, 116b and the line structures 114a, 114b may be formed separately or concurrently in a single deposition process. In an embodiment of the disclosure, the line structures 114a, 114b may serve as bit lines of the respective first and second memory cells 102, 104.

Figure 3:
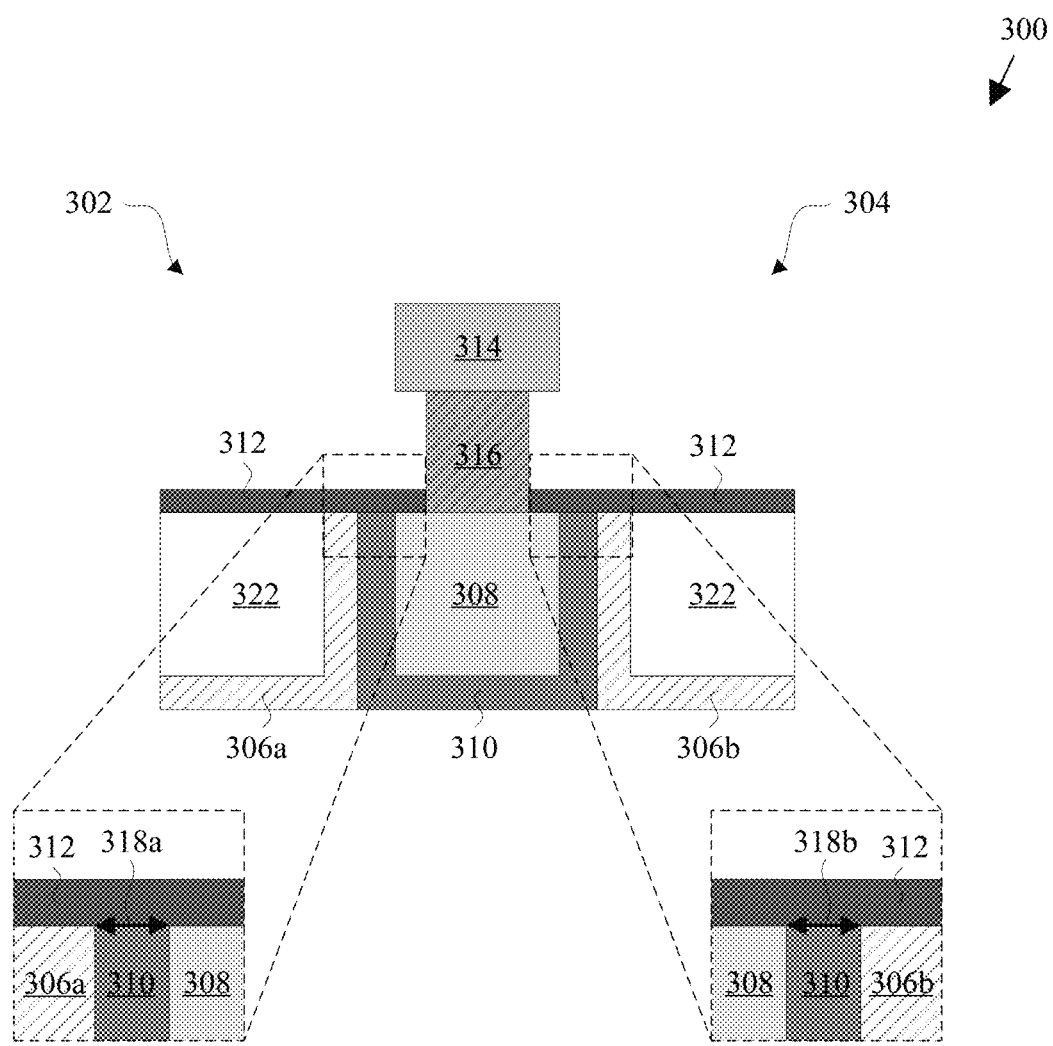
FIG. 3 is a cross-sectional view of a semiconductor memory device, according to another embodiment of the disclosure.

FIG. 3 is a cross-sectional view of a memory device 300, according to an embodiment of the disclosure. The memory device 300 may be arranged in a memory cell region of a semiconductor device and the memory device 300 may be part of a plurality of memory devices arranged in an array configuration of rows and columns in the memory cell region. Only one memory device is illustrated for clarity purposes.

Similar to the memory device 100 in FIG. 1, the memory device 300 may include a plurality of memory cells, including a first memory cell 302 and a second memory cell 304. Each memory cell 302, 304 may be a one-bit memory cell. Accordingly, the memory device 300 may be a two-bit memory device. The memory device 300 may be arranged over a base insulating layer (not shown), where the base insulating layer may be an inter-layer dielectric layer (ILD). In an embodiment of the disclosure, the memory device 300 is a RRAM device.

As illustrated in FIG. 3, each memory cell 302, 304 may include a first electrode 306a, 306b, respectively. The first electrodes 306a, 306b may be referred to as inert electrodes. The first electrodes 306a, 306b may acquire an "L-shaped" profile and a dielectric layer 322 may be arranged over the first electrodes 306a, 306b. The dielectric layer 322 may be referred to as an ILD layer. In an embodiment of the disclosure, uppermost surfaces of the first electrodes 306a, 306b and an upper surface of the dielectric layer 322 may be substantially coplanar. In another embodiment of the disclosure, the first electrodes 306a, 306b may include an inert conductive material, such as, but not limited to, ruthenium, platinum, titanium nitride, tantalum nitride, combinations thereof, or other inert conductive materials known to those skilled in the art. In yet another embodiment of the disclosure, the first electrodes 306a, 306b may have a thickness in a range of about 5 to about 10 nm.

The memory device 300 may include a second electrode 308 arranged between the first electrodes 306a, 306b. The second electrode 308 may be a common electrode shared between the first and second memory cells 302, 304. The second electrode 308 may be referred to as an active electrode. In an embodiment of the disclosure, the second electrode 308 may have an upper surface substantially coplanar with the uppermost surfaces of the first electrodes 306. In another embodiment of the disclosure, the second electrode 308 may include a conductive material such as, but not limited to, tantalum, hafnium, titanium, copper, silver, cobalt, tungsten, combinations thereof, or other conductive materials known to those skilled in the art. In yet another embodiment of the disclosure, the second electrode 308 may have a thickness in a range of about 5 to about 30 nm.

The memory device 300 may further include an insulating element 310. The insulating element 310 may be referred to as a hard mask element. The insulating element 310 may be arranged between the first electrodes 306a, 306b and the second electrode 308. The insulating element 310 may be directly contacting side surfaces of the second electrode 308. Additionally, the insulating element 310 may underlie the second electrode 308 and acquire a "U-shaped" profile, separating the second electrode 308 from the base insulating layer. In an embodiment of the disclosure, the insulating element 310 may have uppermost surfaces substantially coplanar with the upper surface of the second electrode 308. In another embodiment of the disclosure, the insulating element 310 include an electrically insulative material such as, but not limited to, various metal nitrides, for example, silicon nitride, or other electrically insulative materials known to those skilled in the art. In yet another embodiment of the disclosure, the insulating element 310 may have a thickness at most of about 10 nm.

The memory device 300 may yet further include a switching layer 312. The switching layer 312 may overlay and directly contacts the dielectric layer 322, the first electrodes 306a, 306b, the insulating element 310, and the second electrode 308. As illustrated in FIG. 3, the switching layer 112 may extend entirely over an uppermost surface of the first electrodes 306a, 306b. The switching layer 312 may include a dielectric material having a lower dielectric breakdown voltage than the electrically insulative material of the insulating element 310. In an embodiment of the disclosure, the switching layer 312 may include various metal oxides, for example, magnesium oxide, tantalum oxide, hafnium oxide, titanium oxide, aluminum oxide, silicon oxide, combinations thereof, or other dielectric materials known to those skilled in the art. In another embodiment of the disclosure, the switching layer 312 may have a thickness in a range of about 2 to about 10 nm.

The memory device 300 may be provided with a line structure 314. The line structure 314 may serve as a bit line of the memory device 300. In an embodiment of the disclosure, an electrically conductive via structure 316 may be provided to electrically couple the line structure 314 and the second electrode 308. The via structure 316 may extend through the switching layer 312 to be electrically coupled to the second electrode 308. The line structure 314 and the via structure 316 may include an electrically conductive material such as, but not limited to, aluminum, copper, tungsten, alloys thereof, combinations thereof, or other electrically conductive materials known to those skilled in the art.

As mentioned above, the memory device 300 may be a two-bit memory device. Similar to the memory device 100, the first memory cell 302 of the memory device 300 may be programmed by applying a sufficiently large potential difference between the first and second electrodes 306a, 308 of the first memory cell 302 to form one or more conducting filaments 318a between the first and second electrodes 306a, 308. Similarly, the second memory cell 304 of the memory device 300 may be programmed by applying a sufficiently large potential difference may be applied between the first and second electrodes 306b, 308 of the second memory cell 304 to form one or more conducting filaments 318b between the first and second electrodes 306b, 308.

As the dielectric breakdown voltage of the switching layer 312 is lower than that of the insulating element 310, it may be expected that the one or more conducting filaments 318a, 318b may be formed between the upper corners of the first and second electrodes 306a, 308 of the first memory cell 302 and the upper corners of the first and second electrodes 306b, 308 of the second memory cell 304 when a sufficiently large potential difference is being applied thereto to cause a dielectric breakdown of the switching layer 312. The formation of the one or more conductive filaments 318a, 318b may be substantially confined at the interface between the switching layer 312 and the insulating element 310 respectively; the one or more conducting filaments 318a, 318b may be formed laterally between upper corners of the first and second electrodes 306a, 308 of the first memory cell 302 and laterally between upper corners of the first and second electrodes 306b, 308 of the second memory cell 304.

The states of the first and second memory cells 302, 304 may be read through the line structure 314. For example where the first and second memory cells 302, 304 have been programmed, the line structure 314 will read a first current level. In another example, where the first and second memory cells 302, 304 have been erased, the line structure 314 will read a second current level, the second current level being lower than that of the first. In another example, where the first memory cell 302 is the only memory cell being programmed, the line structure 314 will read a third current level, the third current level being lower than that of the first and higher than that of the second. In an embodiment of the disclosure, the third current level is approximately half the current level of the first current level.

To write or program the memory device 300, a sufficiently large potential difference may be applied to the first memory cell 302 and/or the second memory cell 304. For example, the memory device 300 may be in a (11) state when both memory cells 302, 304 have been programmed. In another example, the memory device 300 may be in a (10) state when only the first memory cell 302 has been programmed and the second memory cell 304 is erased. In yet another example, the memory device 300 may be in a (01) state when only the second memory cell 304 has been programmed and the first memory cell 302 is erased, FIGS. 4A to 4F are cross-sectional views that illustrate a method of forming the memory device 300 in FIG. 3, according to an embodiment of the disclosure. Certain structures may be conventionally fabricated, for example, using known processes and techniques, and specifically disclosed processes and methods may be used to achieve individual aspects of the present disclosure.

Figure 4A:
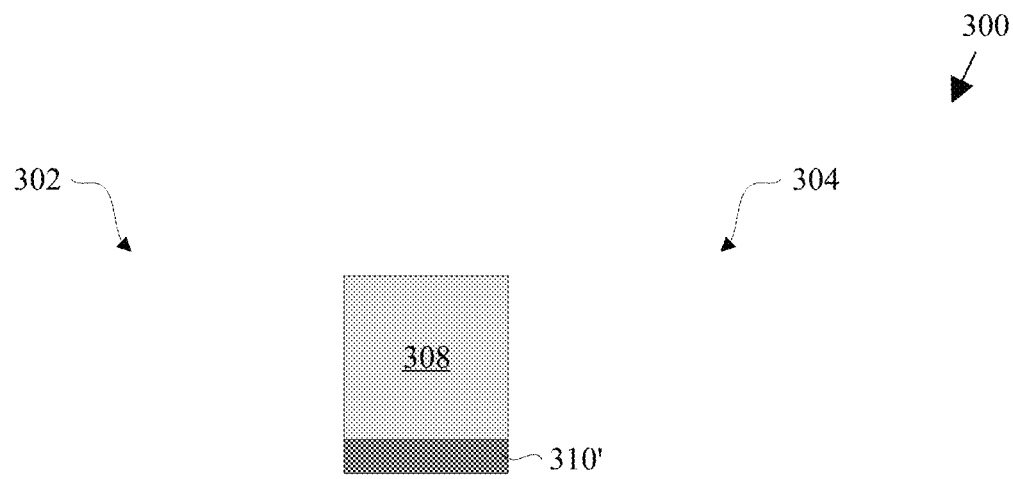
FIGS. 4A to 4F are cross-sectional views that illustrate a method of forming the semiconductor memory device in FIG. 3, according to an embodiment of the disclosure.

FIG. 4A illustrates a first portion of an insulating element 310' and a second electrode 308 of the memory device 300, according to an embodiment of the disclosure. The first portion of the insulating element 310' and the second electrode 308 may be formed over a base insulating layer (not shown). The memory device 300 may be a two-bit memory device and may include a first region to form a first memory cell 302 and a second region to form a second memory cell 304. The first and second memory cells 302, 304 may be formed at laterally opposite sides of the second electrode 308 and may form a bit cell of the memory device 300, respectively.

A first layer of insulative material may be deposited over the base insulating layer and a layer of conductive material may be deposited over the first layer of insulative material using various deposition techniques. The first layer of insulative material and the layer of conductive material may be patterned using a patterning technique to form the first portion of the insulating element 310' and the second electrode 308, respectively. The patterning technique may be a one-step or multi-step process. The second electrode 308 may be a common electrode shared between the first and second memory cells 302, 304.

Figure 4B:
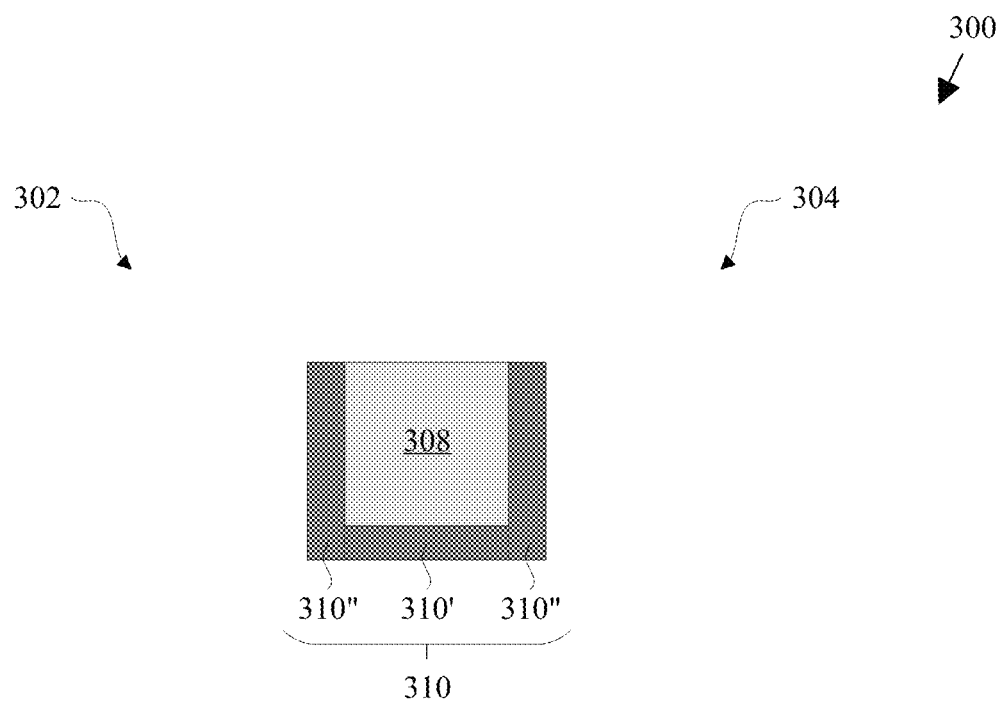

FIG. 4B illustrates the memory device 300 after forming a second portion of the insulating element 310", respectively, according to an embodiment of the disclosure. A second layer of insulative material may be deposited over the second electrode 308 using a deposition technique. The second layer of insulative material may overlay an upper surface and sidewalls of the second electrode 308 and sidewalls the first portion of the insulating element 310'. Additionally, the second insulative material may overlay the base insulating layer. In an embodiment of the disclosure, the layer of insulative material may be deposited using a conformal deposition process; for example, a conformal CVD process or an ALD process.

The second insulative material may be patterned using a patterning technique to retain portions of the second insulative material on the sidewalls of the second electrode 308 and the first portion of the insulating element 310' to form the second portions of the insulating element 310". The first and second portions of the insulating element 310', 310" form an insulating element 310 for the memory device 300; an interface between the first and second portions of the insulating element 310', 310" is demarcated by a dashed line. The insulating element 310 may embed the second electrode 308. The insulating element 110 may be referred to as a hard mask element. The upper surface of the second electrode 308 may be exposed after the patterning technique.

It will be appreciated that the first and second portions of the insulating element 310', 310" may include the same insulative material for ease of fabrication. However, it is understood that the first and second portions of the insulating element 310', 310" may not necessarily be formed of the same insulative material, even though FIG. 4B illustrates them as such. It will be further appreciated that the first and second portions of the insulating element 310', 310" may have different thicknesses even though FIG. 4B illustrates them as having a similar thickness. For example, the first portion 310' of the insulating element may have a thickness greater than that of the second portions 310". In an embodiment of the disclosure, the second portions of the insulating element 310" may have a thickness at most of about 10 nm.

Figure 4C:
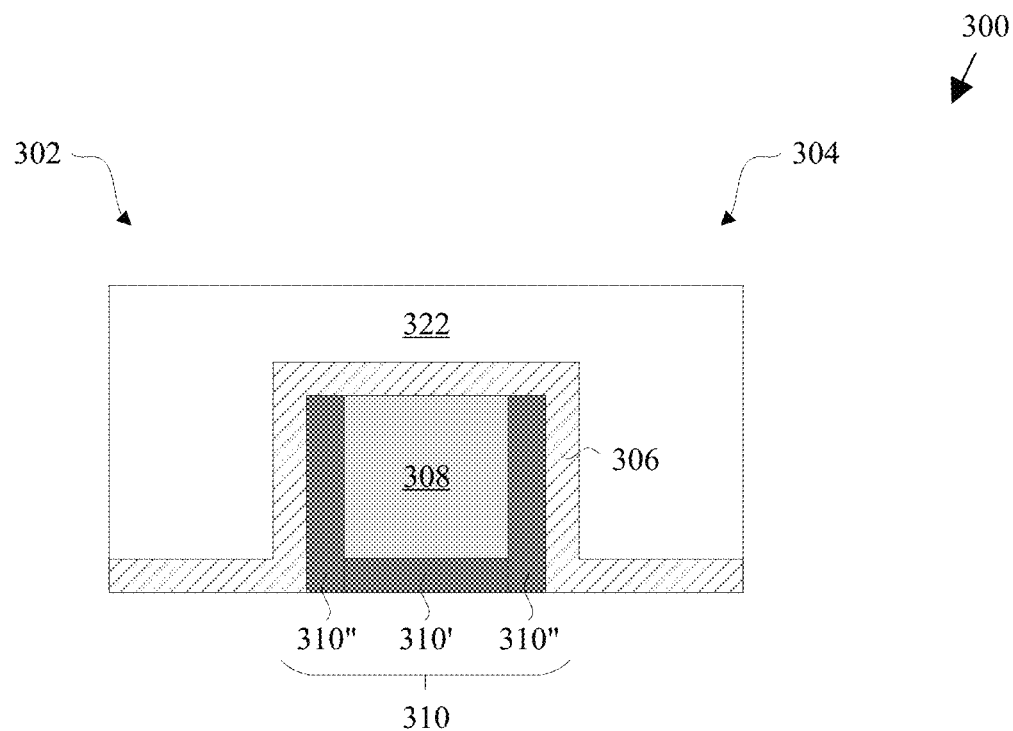

FIG. 4C illustrates the memory device 300 after depositing a layer of inert conductive material 306 and a layer of dielectric material 322, according to an embodiment of the disclosure. The layer of inert conductive material 306 may be deposited over the insulating element 310 and the second electrode 308 using a deposition technique. In an embodiment of the disclosure, the inert conductive material 306 may be deposited using a conformal deposition process; for example, a conformal CVD process or an ALD process. The layer of inert conductive material may overlay the base insulating layer.

A patterning technique may be performed to define and electrically isolate a plurality of memory devices, including the memory device 300, by removing portions of the layer of inert conductive material 306 that are overlaying the base insulating material. The patterning technique may include using a photoresist mask or reticle. The layer of dielectric material 322 may be deposited over the inert conductive material 306 using a deposition technique after the patterning techniques to electrically isolate the plurality of memory devices that may be arranged in an array configuration of rows and columns.

Figure 4D:
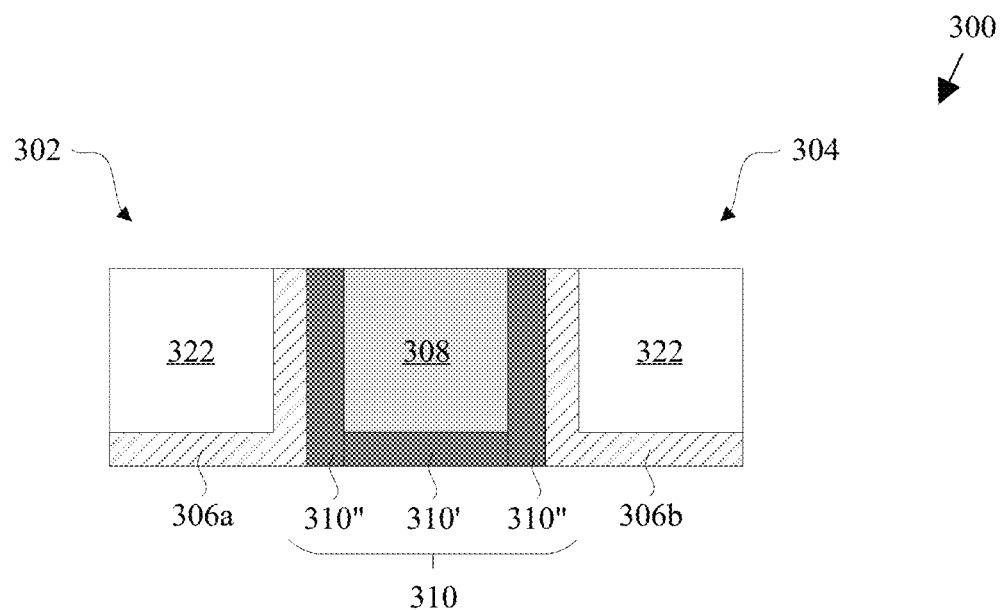

FIG. 4D illustrates the memory device 300 after forming first electrodes 306a, 306b of their respective first and second memory cells 302, 304, according to an embodiment of the disclosure. A planarization technique, such as a chemical-mechanical planarization (CMP) process, may be performed to remove a portion of the dielectric material 322 and a portion of the layer of inert conductive material 306 over the upper surface of the second electrode 308 to form the first electrodes 306a, 306b of the respective first and second memory cells 302, 304. The upper surface of the second electrode 308 and the uppermost surfaces of the insulating element 310 may be exposed after the planarization technique. It will be appreciated that in order to get a substantially planar topography over the memory device 300, a portion of the insulating element 310 and the second electrode 308 may be removed during the planarization technique.

Figure 4E:
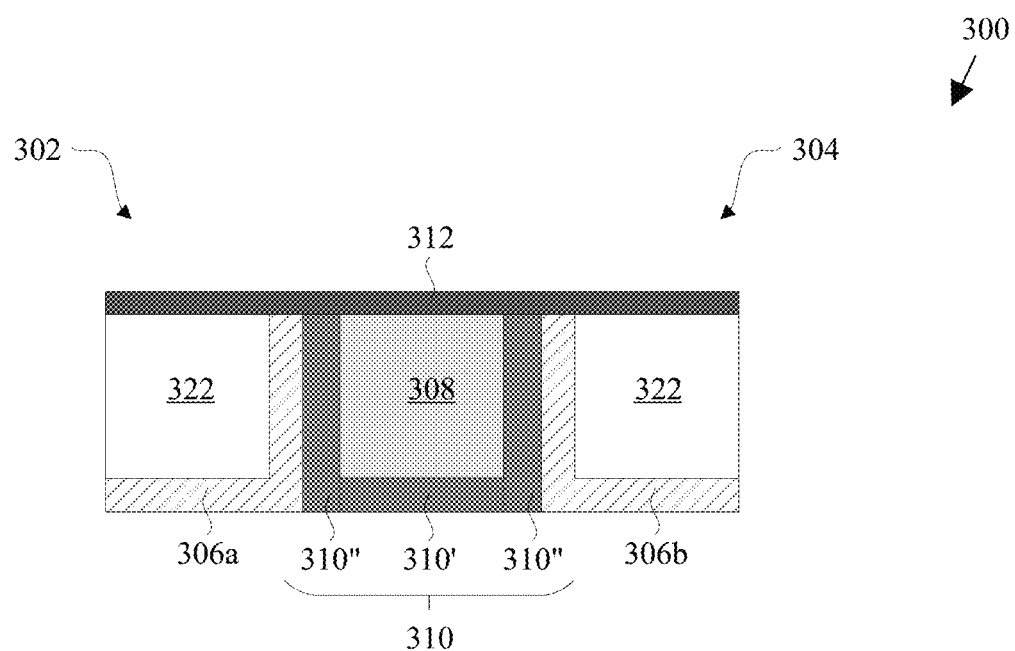

FIG. 4E illustrates the memory device 300 after forming a switching layer 312, according to an embodiment of the disclosure. The switching layer 312 may be synonymous with the switching layer 112 in FIG. 1. A layer of dielectric material may be deposited over the memory device 300 using a deposition technique to form the switching layer 312. The switching layer 312 may be expected to acquire a substantially similar planar topography. Due to the substantially planar topography, the deposition technique to form the switching layer 312 may be controlled effectively to form the switching layer 312 having a substantially uniform thickness.

Figure 4F:
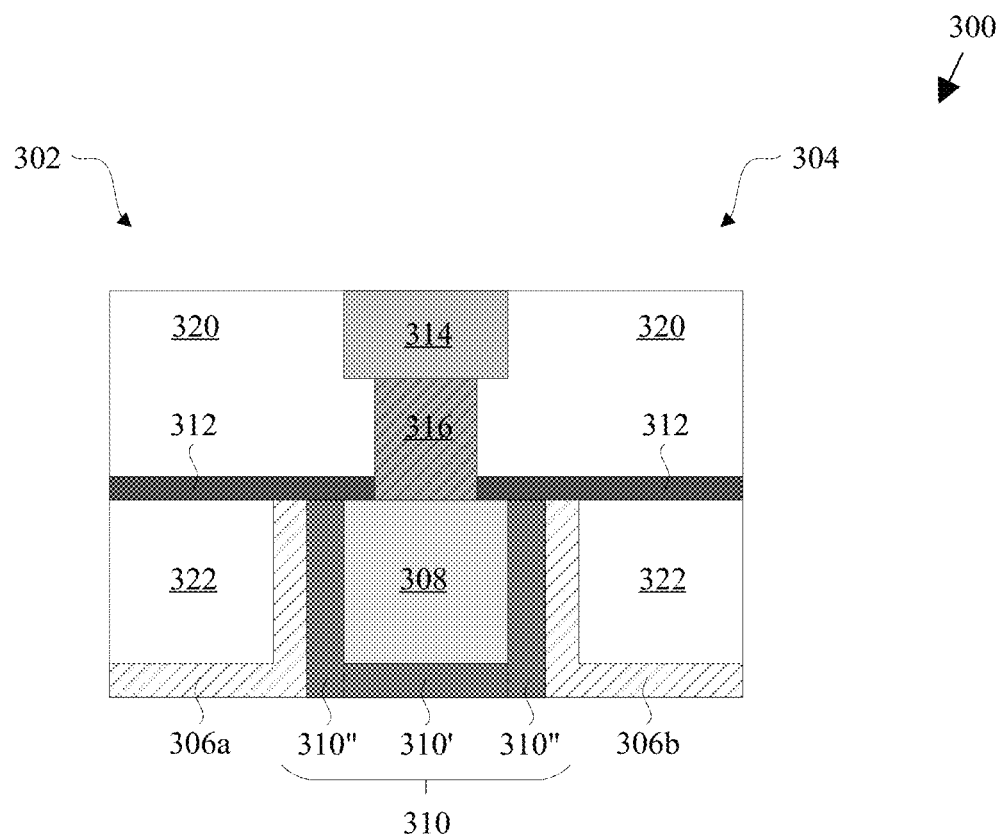

FIG. 4F illustrates the memory device 300 after forming a line structure 314 and a via structure 316, according to an embodiment of the disclosure. The line structure 314 and the via structure 316 may be synonymous with the line structure 114a/114b and the via structure 116a/116b in FIG. 1. A dielectric layer 320 may be deposited over the switching layer 312 using a deposition technique. Openings and/or trenches may be formed in the dielectric layer 320 and an electrically conductive material may be deposited therein to form the via structure 316 and/or the line structure 314 over the second electrode 308. The via structure 316 and the line structure 314 may be formed separately or concurrently in a single deposition process. In an embodiment of the disclosure, the line structure 314 may serve as a bit line of the memory device 300.

Figure 5:
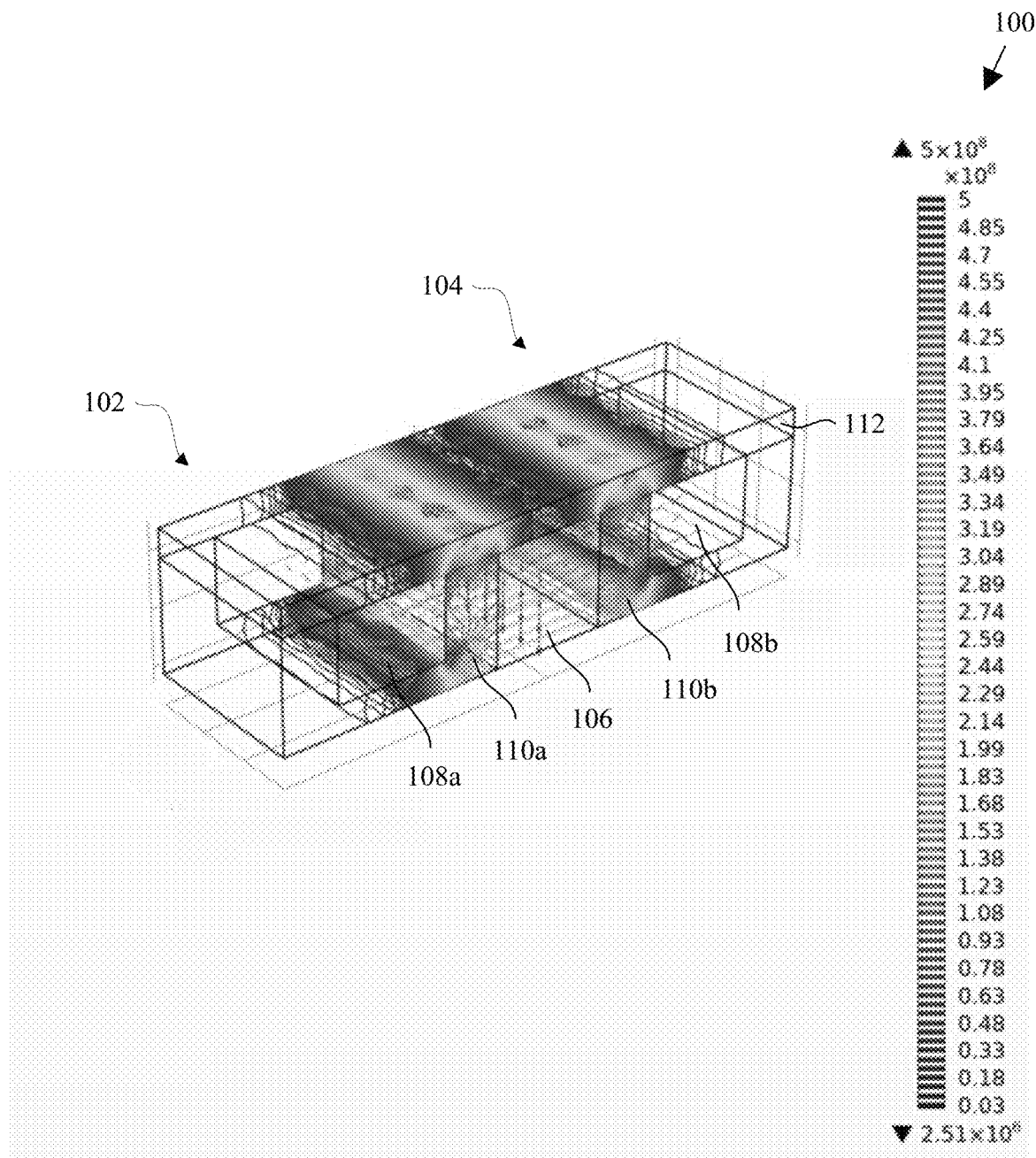
FIG. 5 illustrates simulated electric fields in the semiconductor memory device of FIG. 1, according to an embodiment of the disclosure.

FIG. 5 illustrates simulated electric fields in the semiconductor memory device 100 in FIG. 1 when a sufficiently large potential difference is applied between the first and second electrodes 106, 108a, 108b of the first and second memory cells 102, 104, according to an embodiment of the disclosure. The electric field strengths along the upper and lower corners of the second electrodes 108a, 108b may be higher than that of non-corner regions. These higher electric field strengths may readily facilitate a pathway for the formation of one or more conductive filaments 118a, 118b between the first and second electrodes 106, 108. As the dielectric breakdown voltage of the switching layer 112 is lower than that of the insulating elements 110a, 110b, it may be expected that the one or more conducting filaments 118a, 118b be formed between the upper corners of the first and second electrodes 106, 108a of the first memory cell 102 and the upper corners of the first and second electrodes 106, 108b of the second memory cell 104. Accordingly, the formation of the conductive filaments 118a, 118b may be substantially confined at the interface between the switching layer 112 and the insulating elements 110a, 110b.

As presented in the above disclosure, semiconductor memory devices having improved device performances and methods of forming the same are presented. The memory devices may be a RRAM device having two one-bit memory cells. The memory device may include a pair of electrodes, an insulating element, and a switching layer.

The pair of electrodes and the insulating element form a substantially planar topography upon which the switching layer is formed thereupon. The substantially planar topography advantageously enables the formation of the switching layer to be effectively controlled effectively, thereby enabling the formation of a thin switching layer having a substantially uniform thickness. Thin switching layers advantageously provide stable filament path formation and reduced switching voltages during the operation of the memory devices.

The switching layer may have a lower dielectric breakdown voltage than the insulating element. When a sufficiently large potential difference is applied between the pair of electrodes, one or more conductive filaments may be formed laterally between the pair of electrodes. As the electric fields generated at corner regions of the pair of electrodes are generally stronger than non-corner regions, the one or more conductive filaments may be substantially confined at an interface between the switching layer and the insulating element. Furthermore, the interface provides the shortest conductive path between the pair of electrodes. Accordingly, it will be appreciated that the thickness of the insulating element between the pair of electrodes is as thin as possible, so as to form a relatively short conductive path between the pair of electrodes. For example, in FIG. 4B, the second portion 310" of the insulating element 310 may be formed with a thickness thinner than that of the first portion 310' to facilitate the formation of a short conductive path between the first and second electrodes 306a/306b, 308. The short conductive path advantageously reduces the switching voltages during the operation of the memory devices. The substantially confined region of conducting filaments further advantageously reduces the variability of the switching layer in the FIRS state and provides improved high device-to-device control and cycle-to-cycle control.

Furthermore, the memory devices disclosed in this present disclosure may be compatible with complementary metal-oxide-semiconductor (CMOS) processes using CMOS compatible materials. It will be appreciated that although the memory devices in FIGS. 1 and 3 illustrate two memory cells per memory device, the memory devices may, alternatively, include fewer (e.g., one memory cell) or more memory cells, and therefore the memory devices may have a different number of bits.

Additionally, the memory devices may be configured in a memory array having a cross-bar configuration, a three-dimensional (3D) configuration, combinations thereof, or any other configurations as known to those skilled in the art, to achieve high-density architecture with high parallel programming speed and low power consumption. For example, the 3D configuration may be achieved by repeating the memory devices 100 and 300 in FIGS. 1 and 3, respectively, or combinations thereof.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device, comprising:
a first electrode;
a second electrode adjacent to the first electrode;
a switching layer overlying uppermost surfaces of the first and second electrodes, wherein the switching layer, the first electrode, and the second electrode form a memory cell of the memory device;
a via structure over the uppermost surface of the second electrode; and
a line structure over the second electrode, the line structure electrically coupling to the second electrode through the via structure, wherein the via structure extends through the switching layer and wherein the line structure forms a bit line of the memory device.

2. The memory device of claim 1, further comprising:
an insulating element between the first and second electrodes; and
the switching layer extends over an uppermost surface of the insulating element.

3. The memory device of claim 2, wherein the uppermost surfaces of the first electrode, the second electrode, and the insulating element are substantially coplanar.

4. The memory device of claim 1, wherein the switching layer comprises a dielectric material having substantially planar topography.

5. The memory device of claim 4, wherein the switching layer extends entirely over the uppermost surface of the first electrode.

6. The memory device of claim 1, wherein the memory cell is a first memory cell, further comprising a second memory cell, wherein the first electrode is a common electrode between the first and second memory cells.

7. The memory device of claim 6, wherein the second memory cell comprises:
a third electrode adjacent to a side of the first electrode laterally opposite to the second electrode;
an insulating element between the first and third electrodes; and
the switching layer overlying uppermost surfaces of the third electrode and the insulating element.

8. The memory device of claim 7, further comprises a line structure over the third electrode, the line structure electrically coupling to the third electrode, wherein the line structure forms a bit line of the memory device.

9. The memory device of claim 1, wherein the memory cell is a first memory cell, further comprising a second memory cell, wherein the second electrode is a common electrode between the first and second memory cells.

10. The memory device of claim 9, wherein the second memory cell comprises:
   a third electrode at a side of the second electrode laterally opposite to the first electrode; and
   the switching layer overlying over an uppermost surface of the third electrode.

11. The memory device of claim 10, further comprising:
   an insulating element embedding the second electrode, wherein a first portion of the insulating element is between the first and second electrodes, a second portion of the insulating element is between the second and third electrodes, and a third portion of the insulating element underlies the second electrode; and
   the switching layer overlying uppermost surfaces of the first and second portions of the insulating element, wherein the uppermost surfaces of the first and second portions of the insulating element are substantially coplanar with the uppermost surfaces of the first, second, and third electrodes.

12. The memory device of claim 1, wherein the memory cell is a resistive random access memory cell.

13. A memory device, comprising:
   a first electrode;
   a second electrode and a third electrode adjacent to and at laterally opposite sides of the first electrode;
   a first insulating element between the first and second electrodes;
   a second insulating element between the first and third electrodes; and
   a switching layer overlying uppermost surfaces of the first electrode, the second electrode, the third electrode, the first insulating element, and the second insulating element.

14. The memory device of claim 13, wherein the first electrode is an inert electrode.

15. The memory device of claim 13, wherein the second and third electrodes are active electrodes.

16. The memory device of claim 13, wherein the switching layer has a substantially uniform thickness over the uppermost surfaces of the first electrode, the second electrode, the third electrode, the first insulating element, and the second insulating element.

17. A method of forming a memory device, comprising:
   forming a first electrode;
   forming a second electrode adjacent to the first electrode;
   forming an insulating element between the first and second electrodes;
   forming a switching layer overlying uppermost surfaces of the first and second electrodes, wherein the switching layer, the first electrode, and the second electrode form a memory cell of the memory device;
   forming a via structure over the uppermost surface of the second electrode; and
   forming a line structure over the second electrode, the line structure electrically coupling to the second electrode through the via structure, wherein the via structure extends through the switching layer and wherein the line structure forms a bit line of the memory device.

18. The method of claim 17, further comprising performing a planarization technique over the first electrode, the second electrode, and the insulating element before forming the switching layer.

19. The method of claim 17, wherein forming the switching layer comprises depositing a metal oxide dielectric material with substantially planar topography.

* * * * *